(12) United States Patent
Chang et al.

(10) Patent No.: US 9,735,046 B2
(45) Date of Patent: Aug. 15, 2017

(54) SEMICONDUCTOR DEVICE MANUFACTURING METHOD AND STORAGE MEDIUM

(71) Applicant: TOKYO ELECTRON LIMITED, Tokyo (JP)

(72) Inventors: Peng Chang, Miyagi (JP); Kenji Matsumoto, Miyagi (JP); Hiroyuki Nagai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/250,109

(22) Filed: Aug. 29, 2016

(65) Prior Publication Data

US 2017/0062269 A1 Mar. 2, 2017

(30) Foreign Application Priority Data

Aug. 31, 2015 (JP) ................................. 2015-170188

(51) Int. Cl.
*H01L 21/768* (2006.01)
*H01L 23/522* (2006.01)
*H01L 23/532* (2006.01)

(52) U.S. Cl.
CPC .... *H01L 21/76814* (2013.01); *H01L 21/7684* (2013.01); *H01L 21/76831* (2013.01);
(Continued)

(58) Field of Classification Search
None
See application file for complete search history.

(56) References Cited

U.S. PATENT DOCUMENTS

2009/0263965 A1  10/2009  Gordon et al.
2012/0091588 A1*  4/2012  Miyoshi .............. C23C 16/0272
                                                       257/751
(Continued)

FOREIGN PATENT DOCUMENTS

JP    2006-148075 A    6/2006
JP    2008-300568 A    12/2008
(Continued)

*Primary Examiner* — Asok K Sarkar
(74) *Attorney, Agent, or Firm* — Nath, Goldberg & Meyer; Jerald L. Meyer

(57) ABSTRACT

A method of manufacturing a semiconductor device includes preparing a substrate having an interlayer insulating film and a hard mask provided on the interlayer insulating film and having a predetermined pattern, etching the interlayer insulating film to form a trench, forming a $MnO_x$ film through an ALD method in a state where the hard mask is left on the interlayer insulating film, the $MnO_x$ film being turned into a self-forming barrier film by reacting with the interlayer insulating film, performing a hydrogen radical processing on the $MnO_x$ film, forming a Ru film through a CVD method, forming a Cu-based film through a PVD method or by forming a Cu seed through the PVD method, and then performing a Cu plating processing so as to embed the Cu-based film within the trench, and performing a CMP method to remove the hard mask and to form a Cu wiring.

9 Claims, 11 Drawing Sheets

(52) U.S. Cl.
 CPC .. *H01L 21/76832* (2013.01); *H01L 21/76873* (2013.01); *H01L 21/76879* (2013.01); *H01L 23/5226* (2013.01); *H01L 23/53228* (2013.01)

(56) References Cited

U.S. PATENT DOCUMENTS

2015/0262872 A1* 9/2015 Ishizaka ............ H01L 21/76877
 438/643
2016/0276218 A1* 9/2016 Matsumoto ....... H01L 23/53238

FOREIGN PATENT DOCUMENTS

| JP | 2010-021447 A | 1/2010 |
|---|---|---|
| WO | 2012-173067 A1 | 12/2012 |

* cited by examiner

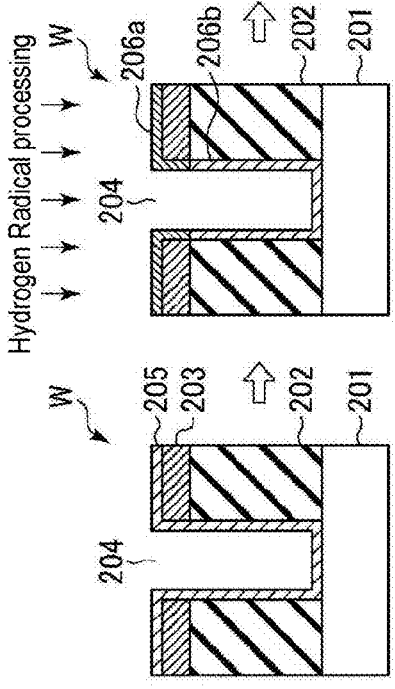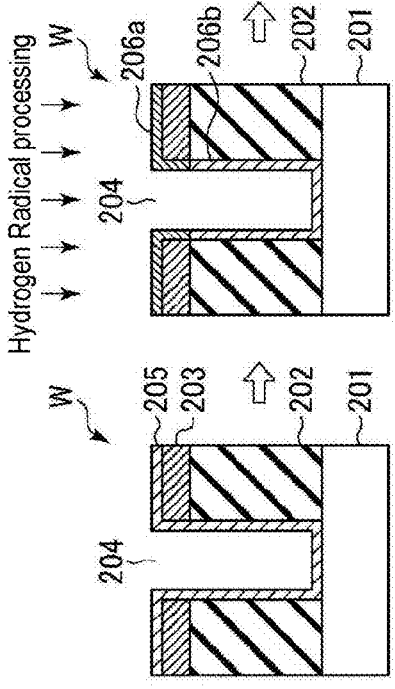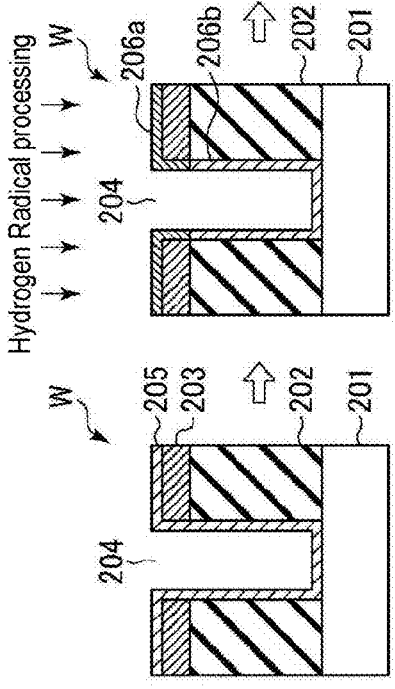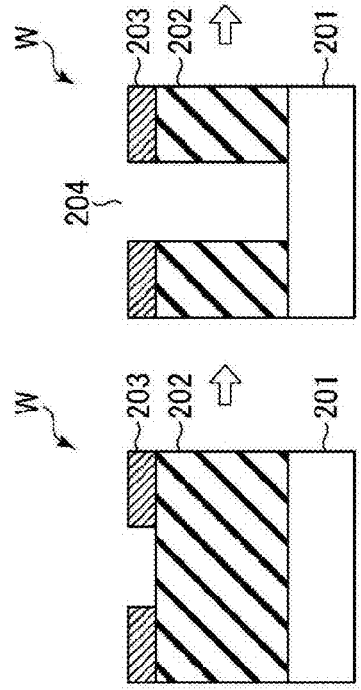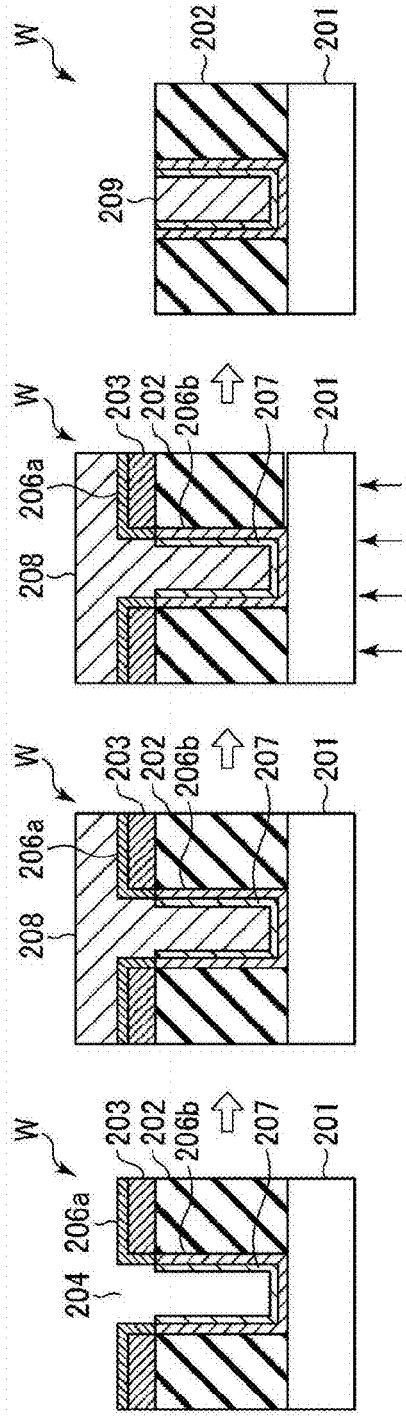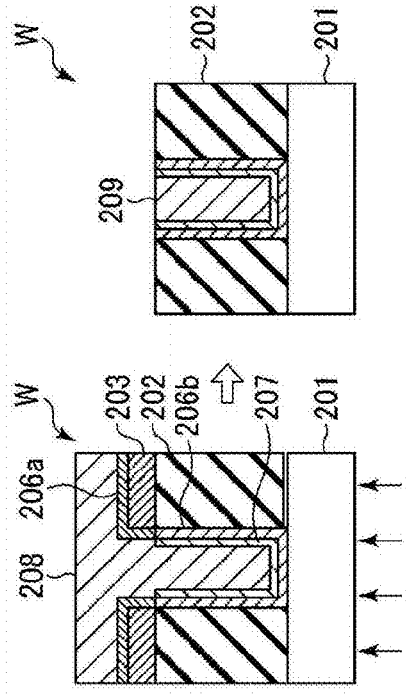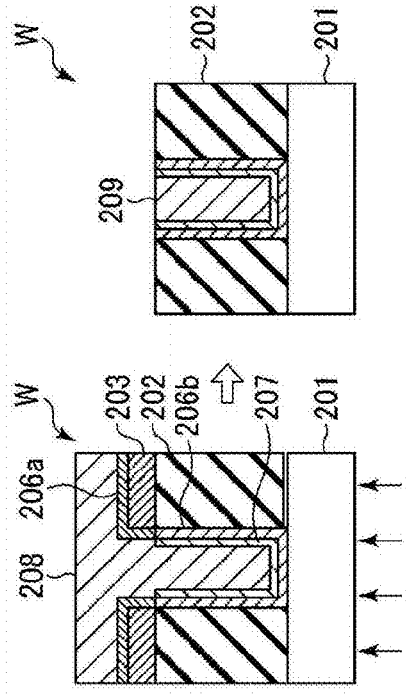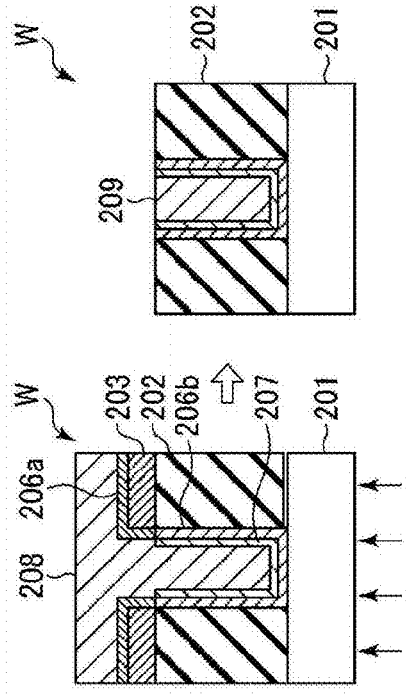

$MnO_x + SiO_x \rightarrow Mn_xSi O_y$

SEMICONDUCTOR DEVICE MANUFACTURING METHOD AND STORAGE MEDIUM

CROSS-REFERENCE TO RELATED APPLICATION

This application claims the benefit of Japanese Patent Application No. 2015-170188, filed on Aug. 31, 2015, in the Japan Patent Office, the disclosure of which is incorporated herein in its entirety by reference.

TECHNICAL FIELD

The present disclosure relates to a semiconductor device manufacturing method that includes a process of embedding Cu in a trench to form a Cu wiring, and a storage medium.

BACKGROUND

In manufacturing a semiconductor device, various processes, such as a film formation process or an etching process, are repeatedly performed on a semiconductor wafer in order to manufacture a desired device. Recently, a resistance reduction (improvement of conductivity) of a wiring and an improvement of an electro-migration resistance have been required in order to cope with requirements for speeding-up, finer-patterning of a wiring, and a high integration of a semiconductor device.

In order to cope with such requirements, Cu has been used as a wiring material. Cu is high in conductivity (low in resistance) and excellent in electro-migration resistance as compared to aluminum (Al) or tungsten (W).

As a Cu wiring forming method, a technique has been proposed, which includes: forming a barrier film formed of tantalum (Ta), titanium (Ti), a tantalum nitride (TaN), a titanium nitride (TiN), or the like through plasma sputtering, which is a Physical Vapor Deposition (PVD) method, over the entire interlayer insulating film in which a trench or a hole is formed; forming a Cu seed film on the barrier film also through plasma sputtering; performing a Cu plating processing thereon to completely embed the trench or the hole; and polishing a superfluous copper film and a barrier film on the surface of the wafer through a Chemical Mechanical Polishing (CMP) processing to remove the copper film and barrier film.

Meanwhile, as the wiring pattern is made further finer, it becomes difficult to obtain sufficient step coverage when a barrier film formed through the PVD method as described above is used. Thus, recently, a manganese oxide $(MnO)_x$ film formed by a Chemical Vapor Deposition (CVD) method or an Atomic Layer Deposition (ALD) method, which is capable of forming a thin film with a good step coverage, has been reviewed as a barrier film. However, since the $MnO_x$ film has poor wettability with Cu, there has been proposed a method of forming a Cu wiring by forming a ruthenium (Ru) film, which has good wettability with Cu, on the MnO film and then forming a Cu film thereon.

However, since the nuclear forming density of Ru is low when the Ru film is formed on the $MnO_x$ film, it is difficult to obtain a Ru film with a good surface condition. Therefore, there has been proposed a technique that performs a hydrogen radical processing after forming the $MnO_x$ film, and then forms a Ru film.

In the case of forming a Ru film on a $MnO_x$ film, the Ru film also needs to be removed through the CMP processing. However, since Ru is highly stable, it is very difficult to perform the CMP processing on Ru. For this reason, an electric characteristic may be deteriorated by a polishing residue containing Ru, or a Cu wiring may be corroded by a specific chemical liquid used when removing Ru. Thus, a product yield may be reduced.

SUMMARY

Some embodiments of the present disclosure provide a semiconductor device manufacturing method capable of removing a problem which may be caused when a Ru film is removed through a CMP processing in forming a Cu wiring by forming the Ru film on a $MnO_x$ film, forming a Cu film thereon, and performing the CMP processing.

Through repeated review to solve the above-described problem, the inventors of the present application have found that, when the formation of a $MnO_x$ film, a hydrogen radical processing, and the formation of a Ru film are performed in a state where a hard mask made of a TiN film or the like is left after a trench is formed, no Ru film is formed in a field portion so that it is not necessary to remove the Ru film during the CMP processing after the Cu is embedded.

According to one embodiment of the present disclosure, there is provided a method of manufacturing a semiconductor device, including: preparing a substrate having an interlayer insulating film and a hard mask provided on the interlayer insulating film and having a predetermined pattern; etching the interlayer insulating film using the hard mask to form a trench; forming a $MnO_x$ film through an ALD method in a state where the hard mask is left on the interlayer insulating film, the $MnO_x$ film being turned into a self-forming barrier film by reacting with the interlayer insulating film; performing a hydrogen radical processing on a surface of the $MnO_x$ film after forming the $MnO_x$ film; forming a Ru film through a CVD method after performing the hydrogen radical processing; forming a Cu-based film through a PVD method or by forming a Cu seed through the PVD method after forming the Ru film, and then performing a Cu plating processing so as to embed the Cu-based film within the trench; and performing a CMP method to remove the hard mask and to form a Cu wiring after performing the Cu plating processing, wherein the hard mask is made of a material which allows an oxide to be formed when the $MnO_x$ film is formed on the hard mask, the oxide not substantially reduced in the hydrogen radical processing, a portion of the $MnO_x$ film corresponding to the hard mask becomes a first Mn-containing film by the hydrogen radical processing as the oxide, a portion of the $MnO_x$ film corresponding to the interlayer insulating film becomes a second Mn-containing film which is reduced by the hydrogen radical processing such that Mn is formed on the surface thereof, and the Ru film is not substantially formed on the first Mn-containing film, and is selectively formed on the second Mn-containing film.

According to another embodiment of the present disclosure, there is provided a non-transitory computer-readable storage medium storing a program that is operated on a computer to control a processing system, wherein the program, when executed, causes the computer to control the processing system such that the aforementioned method is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 2A to 2H are process sectional views for describing the semiconductor device manufacturing method according to the embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Embodiment of Semiconductor Device Manufacturing Method>

Figure 1:
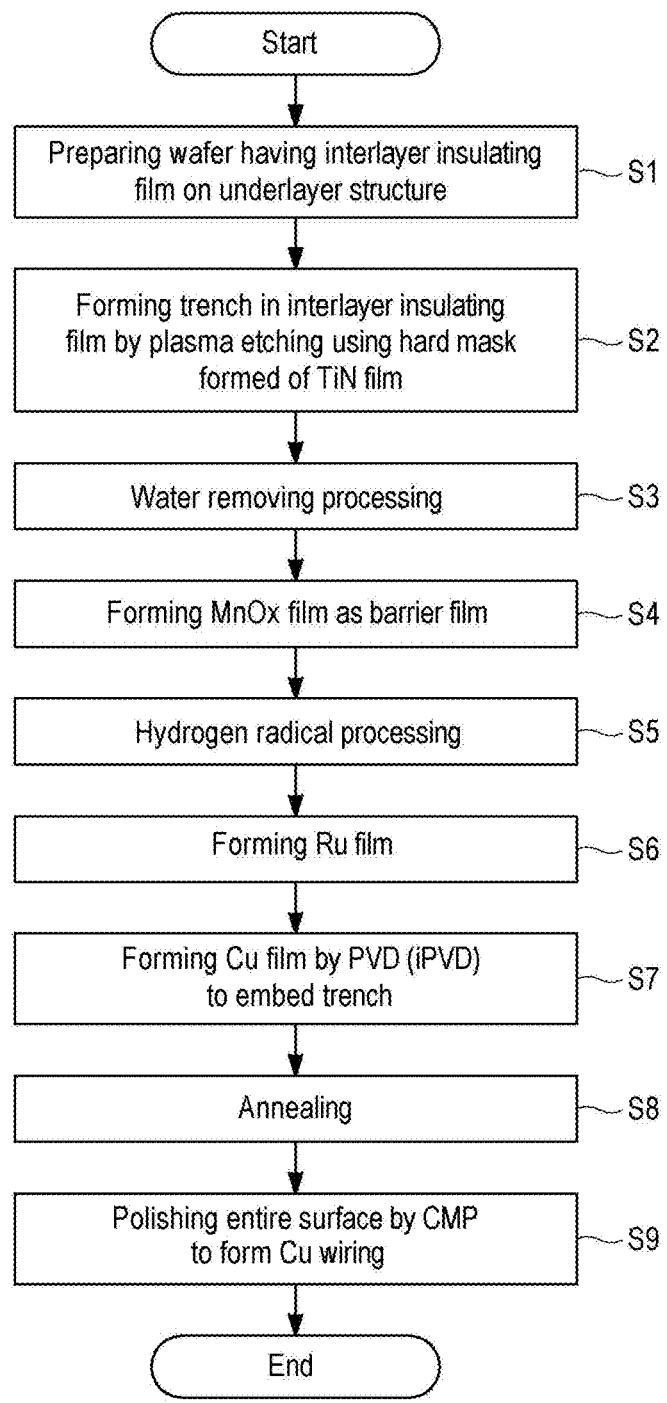
FIG. 1 is a flowchart illustrating a semiconductor device manufacturing method according to an embodiment of the present disclosure.

First, an embodiment of a semiconductor device manufacturing method of the present disclosure will be described first with reference to the flowchart of FIG. 1 and the process sectional views of FIGS. 2A to 2H.

Since manganese oxides may take plural forms, such as MnO, $Mn_3O_4$, $Mn_2O_3$, and $MnO_2$, all the manganese oxides will be collectively indicated as $MnO_x$.

First, a semiconductor wafer (hereinafter, simply referred to as a "wafer") W is prepared. In the wafer W, an interlayer insulating film 202, which is formed of an $SiO_2$ film, a low dielectric constant (Low-k) film (SiCO, SiCOH, or the like), or the like, is formed on a lower structure 201 (of which details are omitted) including an underlayer Cu wiring. A hard mask 203, which is formed of a TiN film patterned through photolithography or the like, is formed on the interlayer insulating film 202 (step S1, FIG. 2A). A trench 204 is formed in the interlayer insulating film 202 through plasma etching using the hard mask 203 (step S2, FIG. 2B). Thereafter, ashing is performed as needed.

In addition, a via hole connected to the underlayer Cu wiring is formed in the bottom of the trench 204. The via hole is omitted in the drawings.

Subsequently, a water is removed from the surface of the insulating film by a degassing process or a pre-cleaning process as a preprocessing for the wafer W after the etching (step S3, not illustrated in FIGS. 2A to 2H). Then, a $MnO_x$ film 205 serving as a barrier film for suppressing a diffusion of Cu is formed on the entire surface including the surface of the trench 204 in a state where the hard mask 203 is left on the interlayer insulating film 202 (step S4, FIG. 2C).

Subsequently, a hydrogen radical processing is performed on the $MnO_x$ film 205 (step S5, FIG. 2D). This processing is performed to reduce the surface of the $MnO_x$ film 205 into Mn in order to facilitate the film formation of the Ru film. However, as will be described later, a portion in the $MnO_x$ film 205, which is in contact with the hard mask 203 formed of the TiN film, is not reduced even by the hydrogen radical processing and becomes a first Mn-containing film 206a having a surface on which Mn is not produced, and only a portion in the $MnO_x$ film 205, which is in contact with the interlayer insulating film 202, is subjected to a surface reduction and becomes a second Mn-containing film 206b having a surface on which Mn is produced. In addition, by the hydrogen radical processing, a portion of the second Mn-containing film 206b is turned into a silicate by a reaction with the interlayer insulating film 202.

Thereafter, a Ru film 207 is formed as a wetting layer which has a high wettability with respect to Cu or a Cu alloy (step S6, FIG. 2E). At this time, the Ru film 207 is formed only on the second $MnO_x$ film 206b having a reduced surface. The Ru film 207 is not formed on the first Mn-containing film 206a which is a not reduced portion in the $MnO_x$ film 205.

Subsequently, a Cu-based film 208 formed of Cu or a Cu alloy is formed on the surface of the Ru film 207 through a PVD method, or an ionized Physical Vapor Deposition (iPVD) method in some embodiments, such that the Cu-based film 208 is embedded in the trench 204 (step S7, FIG. 2F). At this time, the Cu-based film is also embedded in the via hole formed in the bottom of the trench 204. At this time, as needed, a stacked Cu layer may be formed on the entire surface of the wafer W through the Cu plating processing or the like in preparation for a subsequent planarization processing. Alternatively, Cu may be plated to form the Cu-based film 208 after a thin Cu-based seed film is formed through the PVD method and embed the trench. After the Cu-based film 208 is formed, annealing is performed (step S8, FIG. 2G).

Thereafter, the entire surface of the wafer W is polished by a Chemical Mechanical Polishing (CMP) processing so as to perform planarization by removing the Cu-based film 208, the first Mn-containing film 206a, and the hard mask 203 formed of a TiN film, thereby forming a Cu wiring 209 (step S9, FIG. 2H).

After the Cu wiring 209 is formed, a barrier film, which has an etching stop function and is formed of SiN or SiCN, is formed on the entire surface of the wafer W including the Cu wiring 209 and the interlayer insulating film 202. In addition, a metal cap film, such as CoW(P), may be selectively formed on the Cu wiring 209 in the surface of the wafer W.

Next, main processes among a series of the above-described processes will be described in detail.

First, a process of forming a $MnO_x$ film 205 as a barrier film will be described.

The $MnO_x$ film 205 is formed through an ALD method in which a pressure within a process container is set to a depressurized state of about 0.133 to 13.3 Pa, and a manganese compound gas and an oxygen-containing gas, such as $H_2O$, are alternately supplied with a purging process of the inside of the process container performed between the supply of the manganese compound gas and the supply of the oxygen-containing gas. At this time, by the heat during the film formation or the heat of a process after the film formation (e.g., a hydrogen radical processing or an annealing processing), Mn compound reacts with Si and O components of the interlayer insulating film 202 at least in the boundary portion with the interlayer insulating film 202 so that a manganese silicate ($Mn_xSiO_y$, ($MnSiO_3$ or $Mn_2SiO_4$) is formed to be a self-forming barrier film.

Figure 3A:
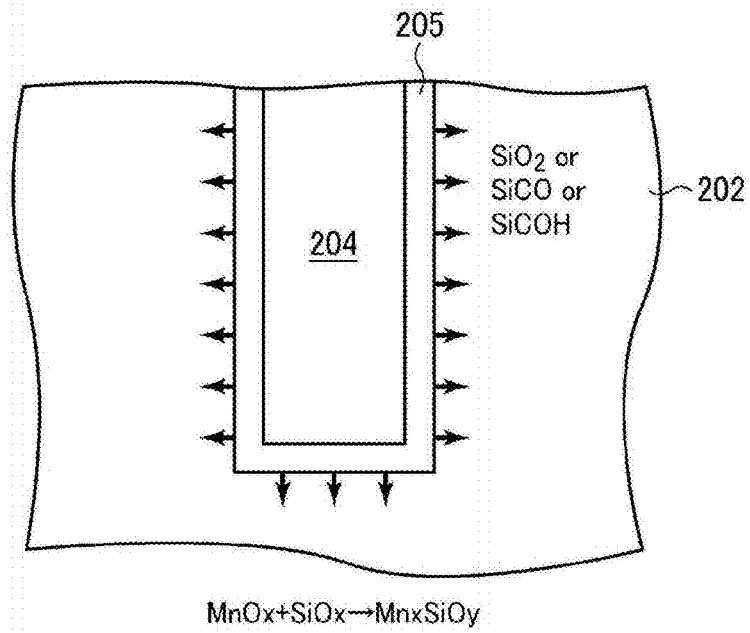
FIGS. 3A and 3B are views for describing a mechanism in which a $MnO_x$ film is formed in a trench to react with a base interlayer insulating film so that a self-forming barrier film is formed.
Figure 3B:
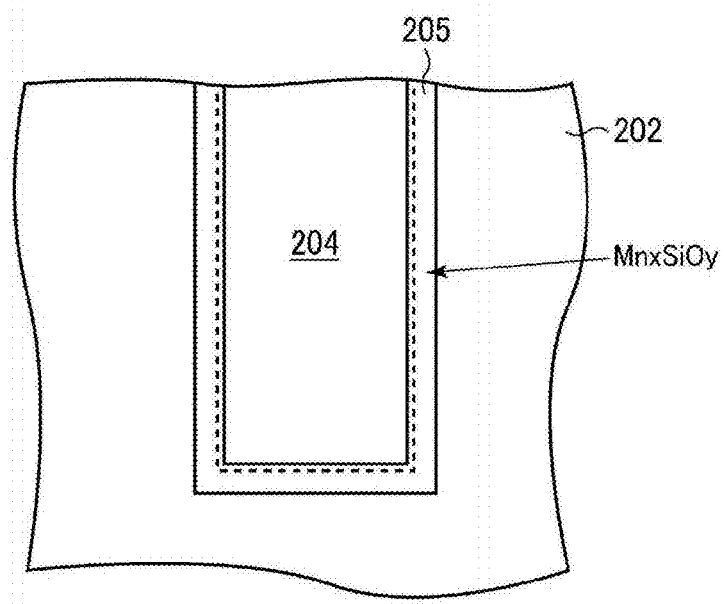

As illustrated in FIG. 3A, in the interlayer insulating film 202, the Mn compound reacts with Si and O contained in the interlayer insulating film 202. Thus, as illustrated in FIG. 3B, the barrier film may be formed at the side of the interlayer insulating film 202 as a base. For this reason, the volume of the barrier film in the trench can be reduced. For example, the volume of the barrier film can be close to zero. Accordingly, it is possible to increase the volume of Cu in the wiring so as to realize the low resistance of the wiring. From the view point of increasing the volume of Cu in the wiring, the $MnO_x$ film 205 may be made thin, and in some embodiments, in a range between 1 and 5 nm.

Figure 4:
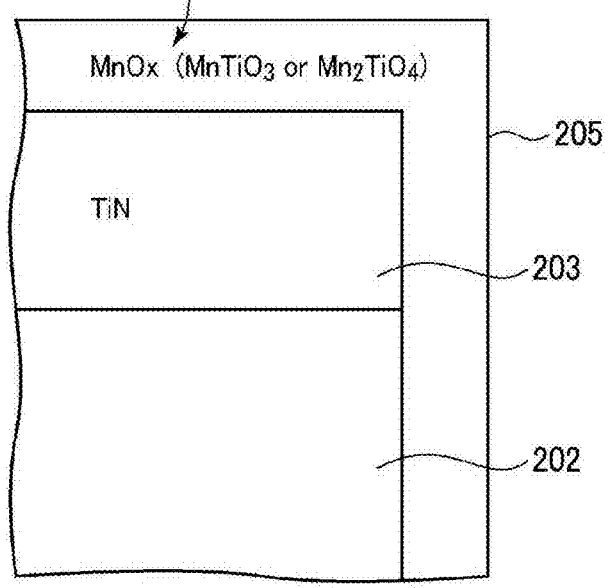
FIG. 4 is a view for describing a mechanism in which a $MnO_x$ film is formed in a trench to react with a TiN film of a hard mask so that $MnTiO_3$ or $Mn_2TiO_4$ is formed.

In addition, on the TiN film that constitutes the hard mask 203, when the $MnO_x$ film is formed, TiN, $H_2O$, and Mn react with each other to produce $MnTiO_3$ or $Mn_2TiO_4$ as illustrated in FIG. 4.

As the manganese compound gas used when forming the $MnO_x$ film 205, a cyclopentadienyl-based manganese compound, an amidinate-based manganese compound, or an amideaminoalkane-based manganese compound is suitable.

As the cyclopentadienyl-based manganese compound, a bis(alkylcyclopentadienyl) manganese expressed as a general formula of $Mn(RC_5H_4)_2$, such as $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, or $(t-BuCp)_2Mn[=Mn(C_4H_9C_5H_4)_2]$ may be used.

As the amidinate-based manganese compound, a bis(N,N'-dialkylacetamidinate) manganese expressed as a general formula of $Mn(R^1N—CR^3—NR^2)_2$ disclosed in U.S. Publication No. US2009/0263965A1 may be used.

As the amideaminoalkane-based manganese compound, a bis(N,N'-1-alkylamide-2-dialkylaminoalkane) manganese expressed as a general formula of $Mn(R'N—Z—NR^2{}_2)_2$ disclosed in International Publication No. WO2012/060428 may be used. Here, in the above general formulas, "R, $R^1$, $R^2$, and $R^3$" are functional groups described as $—C_nH_{2n+1}$ (n is an integer of 0 or more), and "Z" is a functional group described as $—C_nH_{2n}—$ (n is an integer of 1 or more).

Alternatively, as other manganese compounds, a carbonyl-based manganese compound and a beta-diketone-based manganese compound may be used. As the carbonyl-based manganese compound, decacarbonyl 2 manganese ($Mn_2(CO)_{10}$) or methylcyclopentadienyl manganese tricarbonyl $((CH_3C_5H_4)Mn(CO)_3)$ may be used. In particular, since $Mn_2(CO)_{10}$ has a simple structure, it can be expected that an Mn film containing little impurities is formed.

As the oxygen-containing gas, $H_2O$ (vapor), $N_2O$, $NO_2$, NO, $O_3$, $O_2$, $H_2O_2$, CO, $CO_2$, or alcohols, such as methyl alcohol or ethyl alcohol, may be used.

When the $MnO_x$ film 205 is formed through the ALD method, from the viewpoint of preventing the surface from being roughened as the film formation process becomes a CVD mode, it is desirable to set the temperature to be lower than the thermal decomposition temperature of the manganese compound, which is a raw material for film formation. In addition, when the temperature of an organic Mn compound is equal to or below an evaporation start temperature, the organic Mn compound cannot be supplied to the process container as a gas. Thus, the evaporation start temperature becomes a practical lower limit When the organic Mn compound is an amideaminoalkane-based manganese compound, (bis(N,N'-1-alkylamide-2-dialkylaminoalkane)manganese), a thermal decomposition is started at a temperature around 230 degrees C. Thus, it is desirable that the ALD film formation temperature is less than 230 degrees C. In order to effectively evaporate the manganese compound, it is necessary to heat the manganese compound to 80 degrees C. or higher. The ALD film formation temperature may be between 100 degrees C. and 180 degrees C. In some embodiments, the ALD film formation temperature may be around 130 degrees C. in order to prevent the ALD film formation from being turned into a CVD mode as much as possible and to increase the film forming rate. In addition, for the cyclopentadienyl-based manganese compound and the amidinate-based manganese compound, which are also suitable Mn compounds, a film may be formed at a similar film thickness in a similar temperature range.

Next, a hydrogen radical processing will be described.

The hydrogen radical processing is performed to reduce a $MnO_x$ film 205 so as to modify the surface to Mn, which facilitates the film formation of a Ru film. That is, by the hydrogen radical processing, an incubation time for the film formation of the Ru film may be shortened, and the film forming rate at the initial state of the film formation may be increased. Further, it is also possible to make the film quality of the Ru film better (low resistance), to reduce the surface roughness of the Ru film, and to make the Ru film thin and uniform with a high step coverage.

However, portions of the $MnO_x$ film 205, which are in contact with the hard mask 203 formed of a TiN film, are turned into $MnTiO_3$ or $Mn_2TiO_4$ as described above, and these components have a strong oxygen (O) bonding, so that the portions become a first $MnO_x$ film 206a as an oxide without being reduced by the hydrogen radical processing. Thus, only a portion of the $MnO_x$ film 205, which is in contact with the interlayer insulating film 202 is subjected to a surface reduction and becomes a second Mn-containing film 206b which has Mn formed on the surface thereof.

It is desirable that the hydrogen radical processing is performed after forming the $MnO_x$ film 205 without exposing the $MnO_x$ film 205 to the atmosphere. In the case where the $MnO_x$ film is exposed to the atmosphere after forming the same, it is desirable to perform a degassing processing before the hydrogen radical processing in a process container in which the hydrogen radical processing is performed.

Any hydrogen radical processing method may be employed as long as hydrogen radicals (atomic hydrogen) can be generated. For example, a remote plasma processing, a plasma processing, or a process of causing hydrogen gas to be in contact with a heating filament may be exemplified.

In the remote plasma processing, hydrogen plasma is generated using inductively coupled plasma, microwave plasma, or the like outside the process container, and is supplied into the process container so that the processing is performed by the hydrogen radicals within the hydrogen plasma.

In addition, in the plasma processing, capacitively coupled plasma, inductively coupled plasma, or the like is generated within a process container, and the processing is performed by the hydrogen radicals within the hydrogen plasma generated within the process container.

In addition, in the process of causing the hydrogen gas to be in contact with a heating filament, the heating filament functions as a catalyst to generate the hydrogen radicals by a catalytic cracking reaction.

The processing temperature (wafer temperature) of the hydrogen radical processing is an important factor for determining a reducing property of the $MnO_x$ film 205. In order to obtain a sufficient reducing property, the processing temperature is preferably between 200 degrees C. and 400 degrees C., and more preferably between 300 degrees C. and 400 degrees C. in some embodiments. In addition, the processing time of the hydrogen radical processing is also an important factor for determining a reducing property of the $MnO_x$ film 205. In order to obtain a sufficient reducing property, the processing time is preferably 100 sec or more, and more preferably around 300 sec.

The gas supplied when performing the hydrogen radical processing is preferably a gas obtained by adding an inert gas, such as Ar gas, to hydrogen gas, and the concentration of hydrogen at that time is preferably between 1% and 50%. In addition, the processing pressure of the hydrogen radical processing is preferably between 10 Pa and 500 Pa, and more preferably between 20 Pa and 100 Pa.

Subsequently, a process of forming the Ru film 207 as a wetting layer will be described.

Ru has high wettability to Cu. Thus, when a Ru film is formed as a base for Cu, it is possible to secure a good mobility of Cu when a Cu film is formed through the subsequent PVD method and it is also possible to suppress the generation of an overhang that blocks an opening of a trench 204 or a via hole. The Ru film 207 is formed to be thin, preferably in the range of 1 nm to 5 nm in the viewpoint of increasing the volume of a Cu-based material embedded in the trench so as to lower the resistance of a wiring.

The Ru film 207 may be properly formed by using ruthenium carbonyl ($Ru_3(CO)_{12}$) as a raw material for film formation and a thermal CVD method. By this, a highly pure and thin Ru film may be formed with a high step coverage. In this case, it is preferable that the film formation temperature is in the range of 175 degrees C. to 230 degrees C., and the pressure is in the range of 1.3 Pa to 133 Pa.

In addition, the Ru film 207 may be formed through the CVD method using a raw material for film formation other than the ruthenium carbonyl. For example, pentadienyl compounds of ruthenium such as (cyclopentadienyl)(2,4-dimethylpentadienyl)ruthenium, bis(cyclopentadienyl)(2,4-methylpentadienyl)ruthenium, (2,4-dimethylpentadienyl)(ethylcyclopentadienyl)ruthenium, or bis(2,4-methylpentadienyl)(ethylcyclopentadienyl)ruthenium) may be used in forming a film by the CVD method.

The Ru film is easily deposited when the base is a metal, but when the base is an oxide film, the nuclear formation density of Ru is lowered so that the Ru film is hardly deposited thereon. For this reason, the surface of the $MnO_x$ film is reduced to produce Mn to be formed on the surface of the second Mn-containing film 206b by performing the above-mentioned hydrogen radical processing, so that the Ru film 207 can be deposited on Mn.

In this case, the surface of the $MnO_x$ film on the interlayer insulating film 202 is reduced to be turned into the second $MnO_x$ film 206b in which Mn is produced, so that the Ru film 207 can be deposited thereon. However, since the $MnO_x$ film 205 on the hard mask 203 formed of a TiN film, becomes $MnTiO_3$ or $Mn_2TiO_4$, it is not practically reduced even by the hydrogen radical processing and the first $MnO_x$ film 206a as an oxide remains, so that the Ru film 207 is hardly deposited thereon.

That is, the Ru film 207 is selectively formed only in the portion corresponding to the interlayer insulating film 202, but is hardly formed in the portion corresponding to the hard mask 203 formed of the TiN film.

Even if the Ru film 207 is not deposited on the portion corresponding to the hard mask 203 formed of the TiN film, there is no difficulty in securing the mobility of the Cu-based film to be formed thereafter since almost all the portion of the inner wall of the trench 204 is the interlayer insulating film 202.

Subsequently, a process of forming a Cu-based film 208 will be described.

In a case where the Cu-based film 208 is formed by the PVD method, which is a dry process, and a trench is embedded as described above, it is preferable to use the iPVD method in which a film is formed on a wafer while causing ions to be drawn into the wafer.

When embedding the Cu-based film 208, in the case of an ordinary PVD film formation, an overhang may be easily generated to block the opening of a trench or a via hole due to the flocculation of Cu. However, when the iPVD method is used so that a bias power applied to the wafer is adjusted and the film formation action of Cu ions and the etching action by the ions (Ar ions) of a plasma generation gas is controlled, Cu or a Cu alloy may be moved on the Ru film 207 to suppress the generation of the overhang, and a good embedding property can be obtained even in a trench or a via hole that has a narrow opening. At this time, in view of causing Cu to have fluidity so as to obtain a good embedding property, it is preferable to perform the PVD film formation in an annealing process, which is a high temperature process (65 degrees C. to 400 degrees C.) in which Cu migrates and the temperature at that time is preferably between 230 degrees C. and 350 degrees C., and especially preferably around 300 degrees C. When the PVD film formation is performed in a high temperature process as described above, Cu crystal grains can be grown and a grain boundary dispersion can be reduced so that the resistance of the Cu wiring can be lowered. In addition, since the Ru film 207, which has high wettability to Cu or a Cu alloy, is thinly formed in the portion corresponding to the interlayer insulating film 202 of the inner wall of the trench 204 in which the Cu-based film is to be embedded, as a base for the Cu-based film 208, the Cu or the Cu alloy flows without being flocculated so that even in a fine recess, the generation of an overhang can be suppressed, and the Cu-based film 208 (Cu or a Cu alloy) can be securely embedded without generating a void. Meanwhile, the Ru film is hardly formed in the portion corresponding to the surface of the hard mask 203 formed of a TiN film so that the Cu-based film 208 is directly formed on the first Mn-containing film 206a in that portion. In addition, the pressure within the process container (process pressure) when forming a Cu-based film is preferably between 0.133 Pa and 13.3 Pa, and more preferably between 4.66 Pa and 12.0 Pa.

In a case where a Cu-based film 208 is formed by forming a Cu-based seed film by the PVD method and then forming a film by performing the Cu plating processing, thereby embedding the trench, it is not necessary to perform the film formation of the Cu-based film in a high temperature process. The film formation of the Cu-based film may be performed in a typical low temperature process.

A representative example of a Cu alloy to be used as the Cu-based film 208 may include Cu—Al and Cu—Mn. In addition, as another Cu alloy, Cu—Mg, Cu—Ag, Cu—Sn, Cu—Pb, Cu—Zn, Cu—Pt, Cu—Au, Cu—Ni, Cu—Co, or Cu—Ti may be used.

As described above, in the present embodiment, the formation of the $MnO_x$ film 205, the hydrogen radical processing, the formation of the Ru film 207, and the embedding of the Cu-based film 208 are performed in the state where the hard mask 203 formed of a TiN film is left, the Ru film is hardly formed in the portion corresponding to the hard mask 203 formed of the TiN film. Thus, the Cu-based film 208 is formed in that portion without interposing a Ru film. Thus, when performing the CMP processing, it may be sufficient if only the Cu-based film 208, the $MnO_x$ film 205 (first Mn-containing film (206a) which is a barrier film, and the hard mask 203 formed of the TiN film are removed. There is no need to perform the CMP processing to the Ru film. For this reason, it is possible to solve a problem encountered when removing the Ru film by the CMP processing, e.g., deterioration of an electric characteristic by a polishing residue containing Ru or corrosion of a Cu wiring caused by a specific chemical liquid used when removing Ru.

Next, experiment tests for confirming the effects of the present embodiment will be described.

Figure 5:
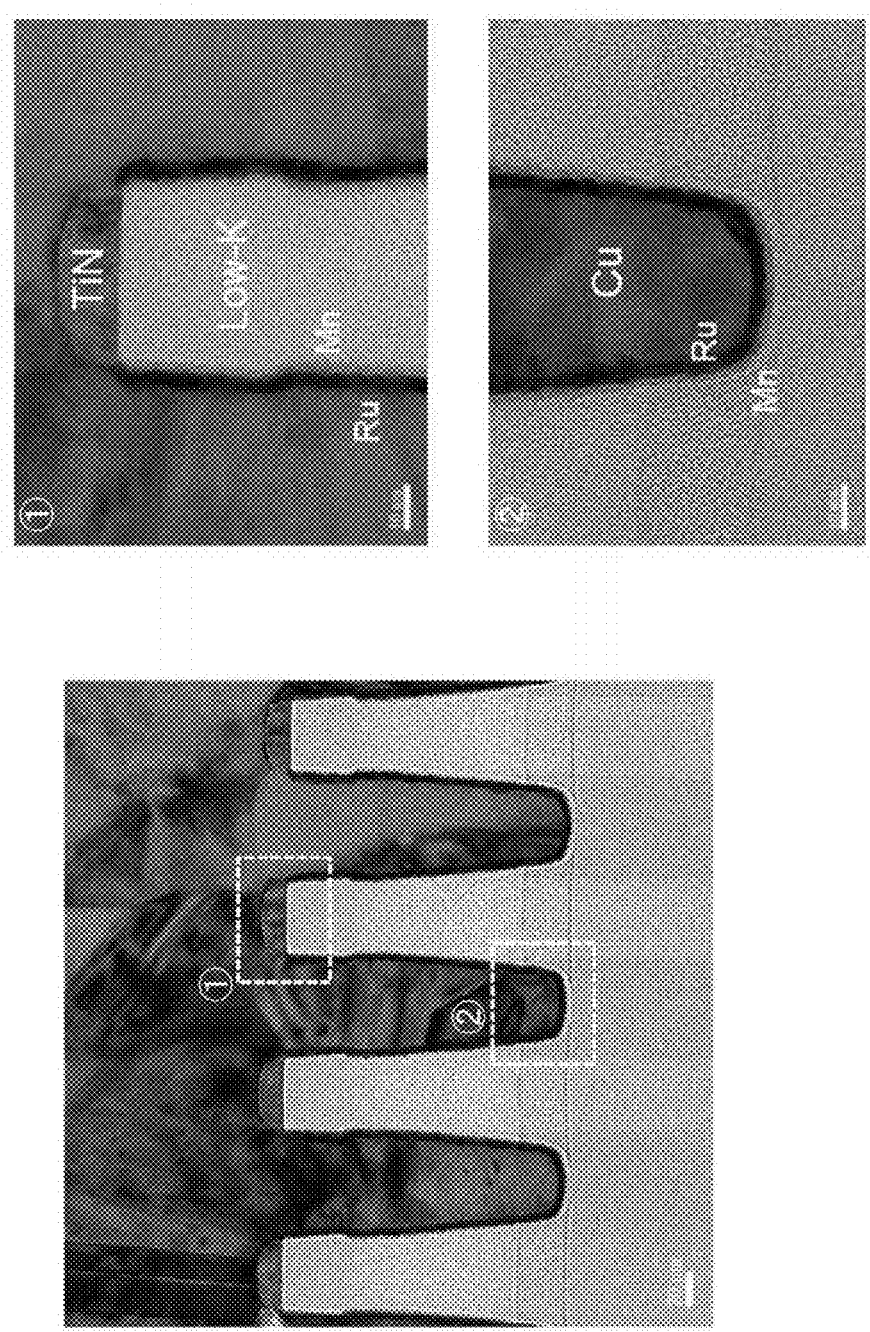
FIG. 5 is a TEM photograph illustrating a cross-section of a sample in which a film formation of a $MnO_x$ film, a hydrogen radical processing, a film formation of a Ru film, and embedding of a Cu film are performed in a state in which a TiN film of a hard mask are left on an interlayer insulating film, according to a semiconductor device manufacturing method according to an embodiment of the present disclosure.

Here, a Low-k film was formed on a silicon wafer as an interlayer insulating film, and trenches were formed by performing plasma etching at lines and spaces with a predetermined interval using a hard mask formed of a TiN film. After that, a $MnO_x$ film was formed using an amideaminoalkane-based manganese compound and $H_2O$ (vapor) in the state where the hard mask is left as it is, and then a hydrogen radical processing was performed using remote plasma. After that, a Ru film was formed by the CVD method using ruthenium carbonyl, and then a Cu film was formed by the iPVD method to fill Cu in the trench. A sectional TEM photograph at that time is represented in FIG. 5. As illustrated in FIG. 5, it has been confirmed that while a Ru film is formed in the portion corresponding to the Low-k film in the vicinity of each trench, no Ru film is formed in a portion corresponding to the TiN film so that the Ru film can be selectively formed in the portion corresponding to the Low-k film.

<Processing System Suitable for Performing Embodiment of the Present Disclosure>

Next, a processing system suitable for performing a semiconductor device manufacturing method according to an embodiment of the present disclosure will be described.

Figure 6:
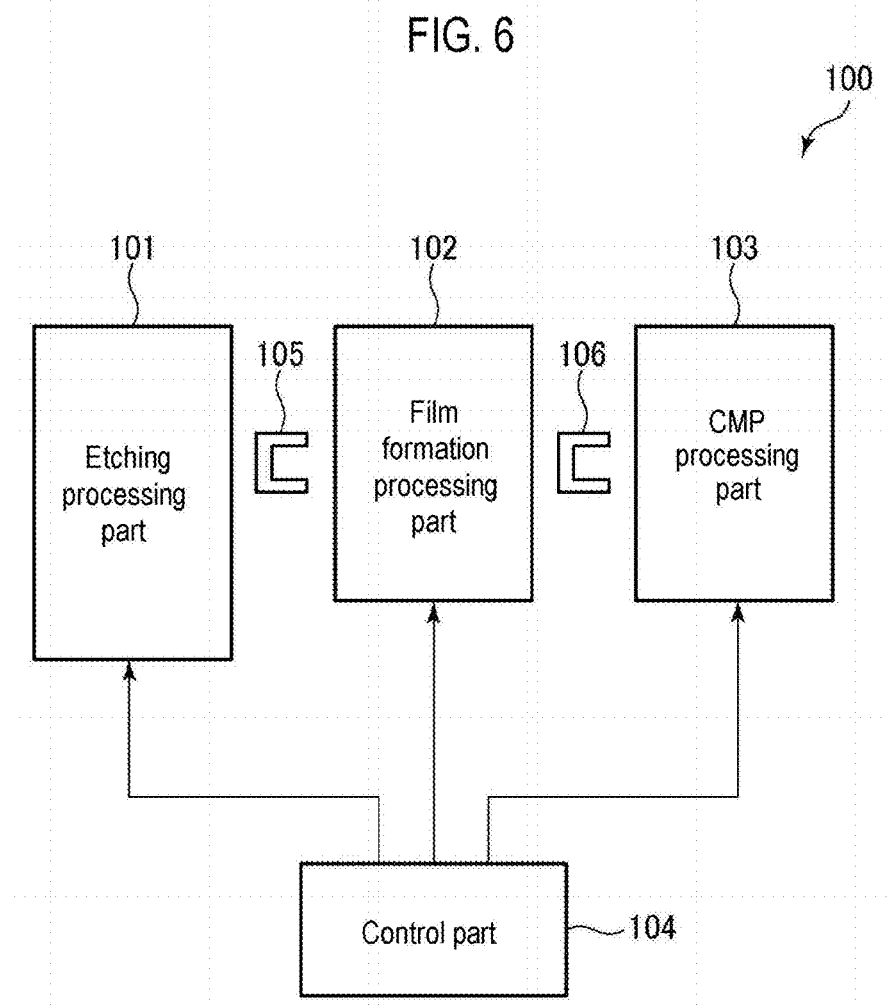
FIG. 6 is a block diagram illustrating a schematic configuration of a processing system suitable for performing a semiconductor device manufacturing method according to an embodiment of the present disclosure.
Figure 7:
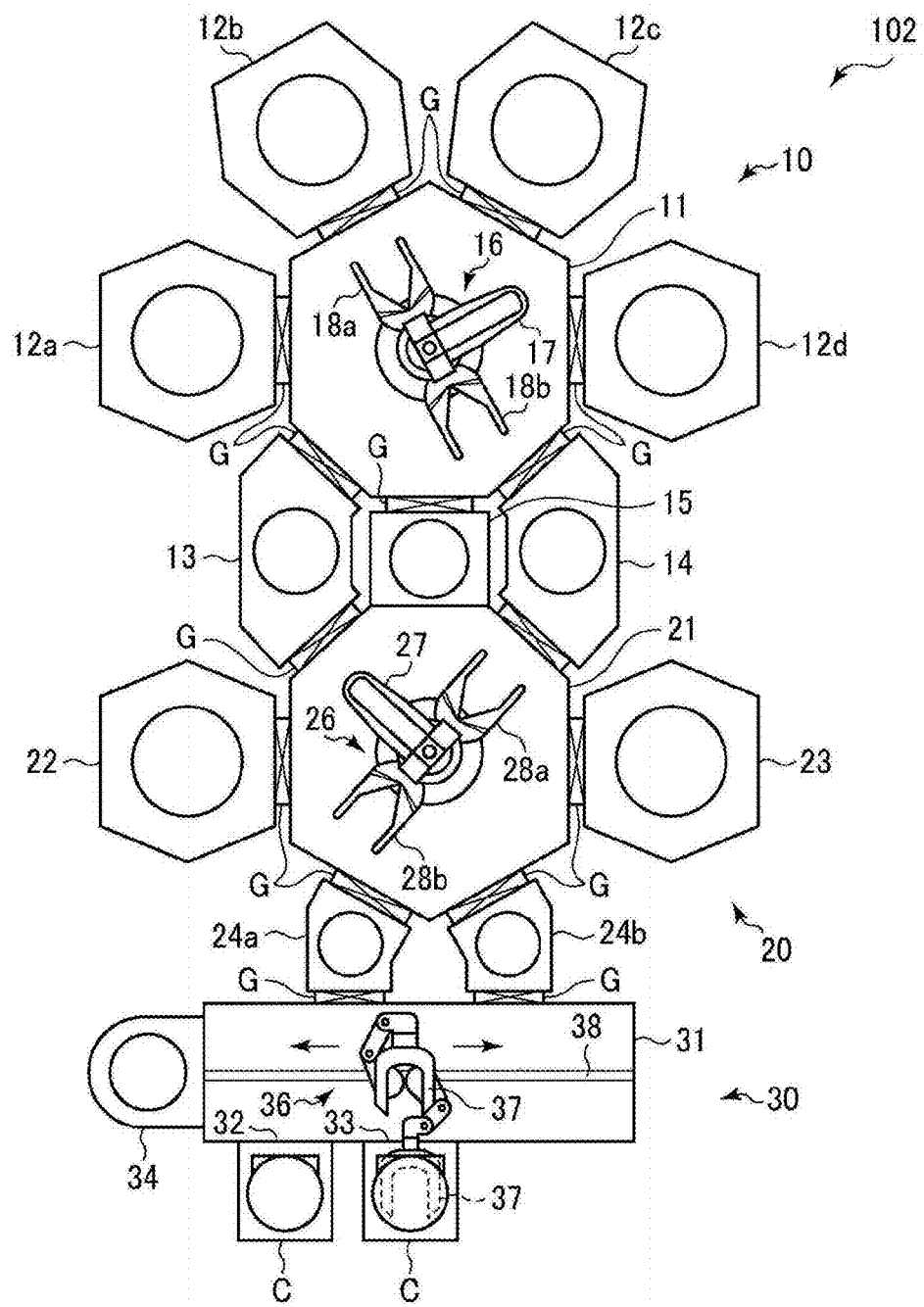
FIG. 7 is a plan view illustrating an example of a film formation processing part in the processing system of FIG. 6.
Figure 8:
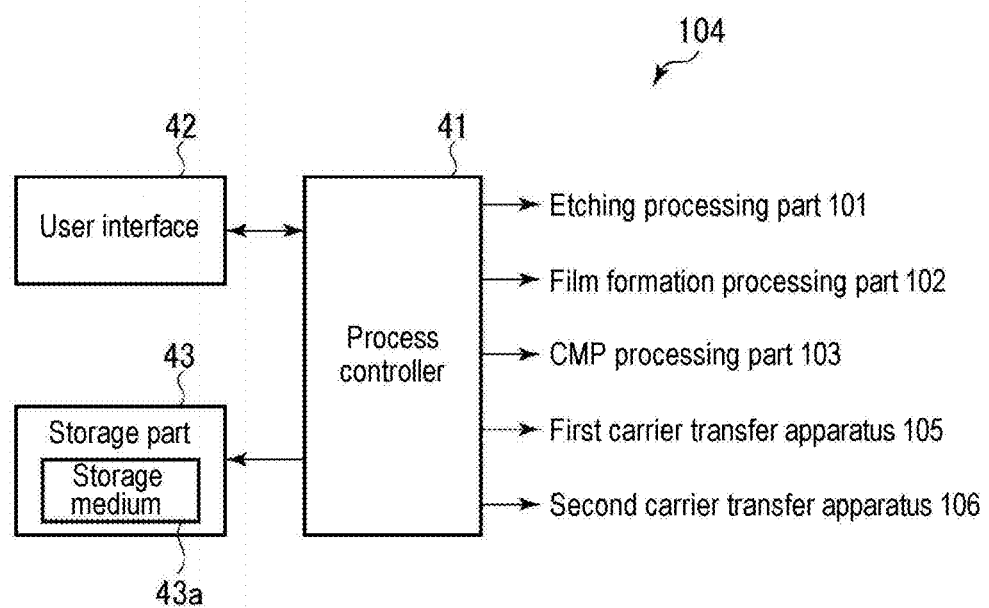
FIG. 8 is a block diagram illustrating a control part in the processing system of FIG. 6.

FIG. 6 is a block diagram illustrating a schematic configuration of a processing system, FIG. 7 is a plan view illustrating an example of a film formation processing part 102 that is a main part of the processing system, and FIG. 8 is a block diagram illustrating a control part 104 in the processing system of FIG. 6.

As illustrated in FIG. 6, the processing system 100 includes: an etching processing part 101 that performs a plasma etching processing; a film formation processing part 102 that performs processes from a degassing processing to the film formation of a Cu-based film; a CMP processing part 103 that performs a CMP processing; a control part 104 configured to control respective components of the Cu wiring manufacturing system 100; a first carrier transfer apparatus 105 that transfers a carrier C that accommodates a wafer W between the etching processing part 101 and the film formation processing part 102, and a second carrier transfer apparatus 106 that transfers a carrier that accommodates a wafer W between the film formation processing part 102 and the CMP processing part 103.

As illustrated in FIG. 7, the film formation processing part 102 includes a first processing section 10 configured to perform a degassing processing, a film formation of a $MnO_x$ film, and a hydrogen radical processing, a second processing section 20 configured to perform a film formation of a Ru film and a film formation of a Cu-based film, and a carry-out/in section 30.

The first processing section 10 includes a first vacuum transfer chamber 11, four (4) $MnO_x$ film forming apparatus 12a, 12b, 12c, and 12d connected to the walls of the first vacuum transfer chamber 11, a degassing chamber 13, and a hydrogen radical processing apparatus 14. The hydrogen radical processing apparatus 14 is configured to perform a degassing processing of the wafer W as well. In addition, the degassing chamber 13 and the hydrogen radical processing apparatus 14 are configured to perform an annealing processing as well. A delivery chamber 15 is connected to the wall part between the degassing chamber 13 of the first vacuum transfer chamber 11 and the hydrogen radical processing apparatus 14 so as to deliver a wafer W between the first vacuum transfer chamber 11 and a second vacuum transfer chamber 21, which will be described later.

The $MnO_x$ film formation apparatuses 12a, 12b, 12c, and 12d, the degassing chamber 13, the hydrogen radical processing apparatus 14, and the delivery chamber 15 are connected, through gate values G, to the sides of the first vacuum transfer chamber 11, respectively.

The inside of the first vacuum transfer chamber 11 is configured to be maintained in a predetermined vacuum atmosphere, and a first transfer mechanism 16 is provided therein to convey the wafer W. The first transfer mechanism 16 is disposed at a substantially central portion of the first vacuum transfer chamber 11, and includes a rotating extensible/contractible part 17 configured to be rotatable and extensible/contractible and two support arms 18a and 18b provided at the front end of the rotating extensible/contractible part 17 and configured to support a wafer W. The first transfer mechanism 16 carries out/in the wafer W in relation to the MnO film formation apparatuses 12a, 12b, 12c, and 12d, the degassing chamber 13, the hydrogen radical processing apparatus 14, and the delivery chamber 15.

The second processing section 20 includes a second vacuum transfer chamber 21, a Ru film formation apparatus 22 and Cu-based film formation apparatus 23, each of which are connected to opposite walls of the second vacuum transfer chamber 21.

The degassing chamber 13 and the hydrogen radical processing apparatus 14 are respectively connected to two walls of the second vacuum transfer chamber 21 at the first processing section 10, and the delivery chamber 15 is connected to the wall between the degassing chamber 13 and the hydrogen radical processing apparatus 14. That is, all of the degassing chamber 13, the hydrogen radical processing apparatus 14, and the delivery chamber 15 are installed between the first vacuum transfer chamber 11 and the second vacuum transfer chamber 21, and the degassing chamber 13 and the hydrogen radical processing apparatus 14 are disposed at the opposite sides of the delivery chamber 15. In addition, two walls of the second vacuum transfer chamber 21 at the carry-out/in section 30 are connected with load lock chambers 24a and 24b, respectively. The load lock chambers allow atmospheric transfer and vacuum transfer, respectively.

The Ru film formation apparatus 22, the Cu-based film formation apparatus 23, the degassing chamber 13, the hydrogen radical processing apparatus 14, and the load lock chambers 24a and 24b are connected, through gate valves G, to the sides of the second vacuum transfer chamber 21, respectively. In addition, the delivery chamber 15 is connected to the second vacuum chamber 21 without a gate valve.

The inside of the second vacuum transfer chamber 21 is configured to be maintained at a predetermined vacuum atmosphere, and a second transfer mechanism 26 is installed therein to perform carry-out/in of a wafer W with respect to the Ru film formation apparatus 22, the Cu-based film formation apparatus 23, the degassing chamber 13, the hydrogen radical processing apparatus 14, the load lock chambers 24a and 24b, and the delivery chamber 15. The second transfer mechanism 26 is disposed at a substantially central portion of the second vacuum transfer chamber 21, and includes a rotating extensible/contractible part 27 configured to be rotatable and extensible/contractible. Two support arms 28a and 28b configured to support the wafer W are provided at the front end of the rotating extensible/contractible part 27 such that the two support arms 28a and 28b are directed opposite to each other.

The carry-out/in section 30 is installed at the opposite side to the second processing section 20 with the load lock chambers 24a and 24b being interposed therebetween, and includes the atmospheric transfer chamber 31 to which the load lock chambers 24a and 24b are connected. A filter (not illustrated) is provided in the upper portion of the atmospheric transfer chamber 31 so as to form a down flow of clean air. Gate valves G are provided in the wall between the load lock chambers 24a and 24b and the atmospheric transfer chamber 31. Two connection ports 32 and 33 are provided in the wall opposite to the wall to which the load lock chambers 24a and 24b of the atmospheric transfer chamber 31 are connected. The carriers C, each of which accommodates a wafer W as a substrate to be processed, may be connected to the connection ports 32 and 33, respectively. In addition, at one side of the atmospheric transfer chamber 31, an alignment chamber 34 is provided to perform the alignment of the wafers W. Within the atmospheric transfer chamber 31, an atmospheric transfer mechanism 36 is provided to perform carry-out/in of the wafers W with respect to the carriers C and carry-out/in of the wafers W with respect to the load lock chambers 24a and 24b. The atmospheric transfer mechanism 36 includes two articulated arms, and is configured to run on a rail 38 along the arrangement direction of carriers C. The atmospheric transfer mechanism 36 is configured to convey a wafer W in a state where the wafer W is put on a hand 37 of the front end of each of the articulated arms.

The etching processing part 101 includes a plasma etching apparatus and an apparatus associated therewith. In addition, an ashing apparatus may be provided as needed. The CMP processing part 103 includes a CMP apparatus and an apparatus associated therewith.

As illustrated in FIG. 8, the control part 104 includes: a process controller 41 configured by a microprocessor (computer) configured to execute a control of each of the components of the etching processing part 101, the film formation processing part 102, and the CMP processing part 103, and the first and second carrier transfer apparatus 105 and 106, a user interface 42 configured by a keyboard on which an operator performs an input operation of a command or the like in order to manage the processing system 100, a display configured to visualize and display a working situation of the processing system 100, or the like; and a storage part 43 that stores a control program to realize a processing executed in the processing system 100 by a control of a process controller 41 or a program to execute a processing in each component according to various data and processing conditions, i.e. a processing recipe. In addition, the user interface 42 and the storage part 43 are connected to the process controller 41.

The recipe is stored in a storage medium 43a in the storage part 43. The storage medium may be a hard disc, or may be a portable disc, such as a CDROM or a DVD, or a semiconductor memory, such as a flash memory. In addition, the recipe may be transmitted from another device through, for example, a dedicated line.

Further, when an arbitrary recipe is called from the storage medium 43a of the storage part 43 and is executed in the process controller 41 by a command or the like from the user interface 42 as needed, a desired processing in the processing system 100 is performed under a control of the process controller 41.

In addition, in a case where laminated Cu layers are formed by the Cu plating processing, the processing system 100 also includes a Cu plating processing part.

Next, operations of the processing system 100 will be described.

A carrier C, which accommodates a wafer that has, on an interlayer insulating film, a hard mask formed of a TiN film with a predetermined pattern, is conveyed to the etching processing part 101, and the plasma etching processing is performed on a wafer W in the etching processing part 101. The carrier C, which accommodates a wafer that has been etched and remains in a state where the hard mask is left on the wafer as it is, is conveyed to the film formation processing part 102. In the film formation processing part 102, a wafer W is taken out from the carrier C by the atmospheric transfer mechanism 36, an alignment processing is performed on the wafer in the alignment chamber 34, and then, the wafer W is conveyed to a load lock chamber 24a or 24b. After the load lock chamber is decompressed to a degree of vacuum that is substantially the same as the second vacuum transfer chamber 21, the wafer W in the load lock chamber is taken out by the second transfer mechanism 26, and is conveyed to the degassing chamber 13 through the second vacuum transfer chamber 21 so as to perform the degassing processing of the wafer W. Thereafter, the wafer W of the degassing chamber 13 is taken out by the first transfer mechanism 16 and is carried into any one of the $MnO_x$ film formation apparatuses 12a, 12b, 12c, and 12d through the first vacuum transfer chamber 11 so as to form a $MnO_x$ film for forming a self-forming barrier film as described above.

After the $MnO_x$ film is formed, the wafer W is taken out by the first transfer mechanism 16 and is conveyed to the hydrogen radical processing apparatus 14 so as to perform the hydrogen radical processing on the surface of the $MnO_x$ film. Thereafter, the wafer W is taken out from the hydrogen radical processing apparatus 14 by the second transfer mechanism 26 and is conveyed to the Ru film formation apparatus 22 through the second vacuum transfer chamber so as to form a Ru film as a wetting layer. At this time, as described above, the Ru film is not formed on the portion corresponding to the hard mask formed of a TiN film. After the Ru film is formed, the wafer W is taken out from the Ru film formation apparatus 22 by the second transfer mechanism 26, and is conveyed to the Cu-based film formation apparatus 23 so as to form a Cu-based film as described above by the iPVD method, thereby performing the embedding of the Cu-based film (Cu or a Cu alloy) to a recess, such as a trench or a via. Thereafter, the wafer W is conveyed to the degassing chamber 13 or the hydrogen radical processing apparatus 14 so as to perform an annealing processing. In addition, the delivery chamber 15 may be used as a buffer that temporarily maintains the wafer W.

After the Cu-based film is formed, the wafer W is conveyed to the load lock chamber 24a or 24b by the second transfer mechanism 26, the load lock chamber is returned to the atmospheric pressure, and then the wafer W formed with the Cu-based film is taken out and returned to the carrier C by the atmospheric transfer mechanism 36. The above-described processes are repeated by the plural times corresponding to the number of wafers W within the carrier.

In addition, in the case where laminated Cu layers are formed, a Cu plating processing is performed by a separately provided Cu plating processing part, and then, annealing is performed. In addition, in the case where the Cu-based film is formed by a combination of a Cu-based seed film and a Cu plating, the Cu-based seed film is formed by the PVD method in the Cu-based film formation apparatus 23, then the Cu plating processing is performed by the separately installed Cu plating processing part, and then annealing is performed.

The carrier C accommodating the wafer W on which the film formation of the Cu-based film has been completed, is conveyed to the CMP processing part 103 by the second carrier transfer apparatus 106 so as to perform the CMP processing.

In the CMP processing part 103, since the Ru film is hardly formed on the TiN film, which is the hard mask, it may be sufficient if only the Cu-based film, the MnO$_x$ film, and the TiN film are removed. That is, it is not necessary to remove the Ru film. When performing the CMP processing, a problem of deteriorating an electric characteristic by a polishing residue containing Ru or a problem of causing corrosion of a Cu wiring by a specific chemical liquid used when removing Ru does not occur.

According to the processing system 100, the processes from the etching to the CMP processing may be performed in a batch. In addition, in the film formation processing part 102, since the degassing processing, the MnO$_x$ film formation processing, the hydrogen radical processing, the Ru film formation processing, and the Cu-based film formation processing are performed in the vacuum without opening the etched wafer to the atmosphere, it is possible to prevent the film oxidation during the processes so that a high-performance semiconductor device can be manufactured.

[iPVD Apparatus]

Figure 9:
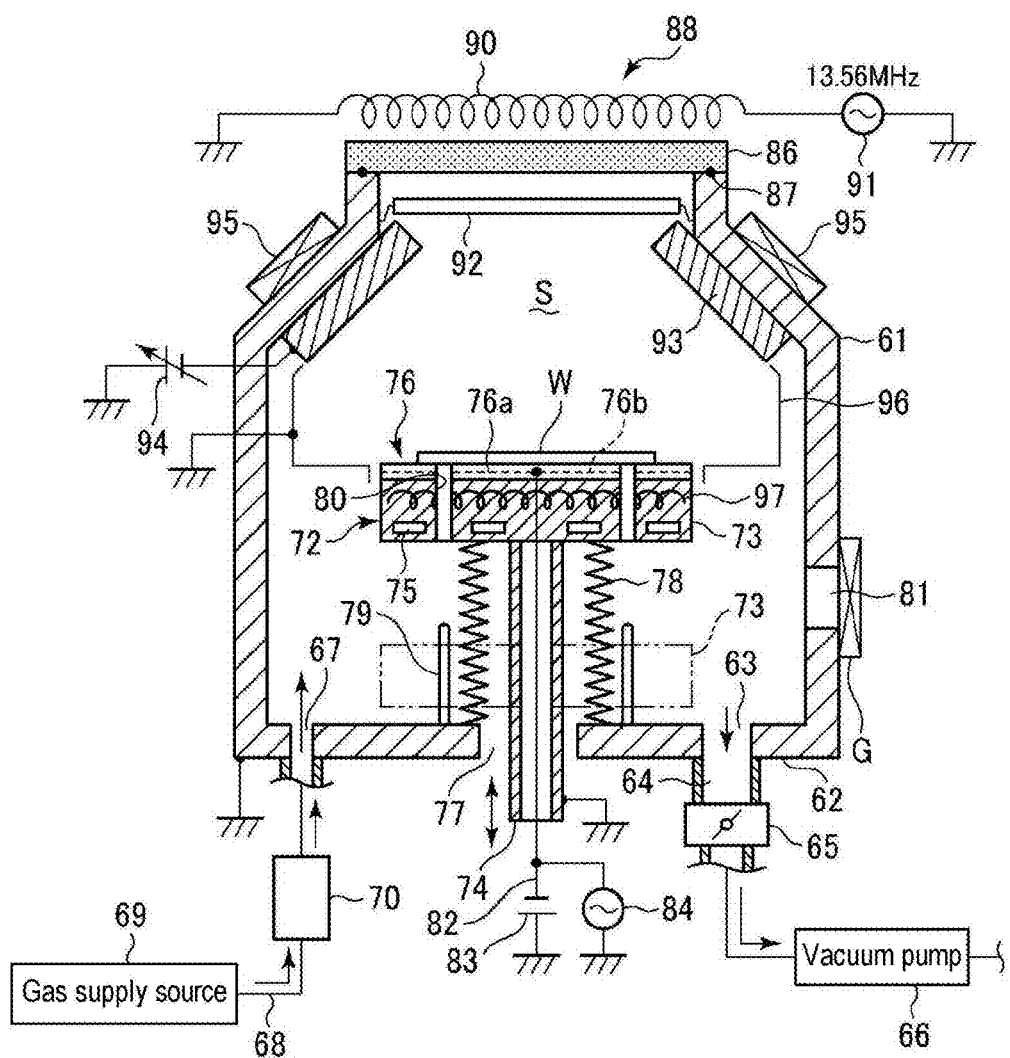
FIG. 9 is a sectional view illustrating an example of an iPVD apparatus which may be properly used in a film formation apparatus of a Cu-based film.

Next, the iPVD method, which may be properly used in the Cu-based film formation apparatus 23 in the processing system 100, will be described with reference to an Inductively Coupled Plasma (ICP) type plasma sputtering apparatus as an example. FIG. 9 is a sectional view illustrating an ICP type plasma sputtering apparatus.

As illustrated in FIG. 9, the PVD apparatus includes a grounded process container 61 formed of a metal, such as aluminum, and a exhaust port 63 and a gas inlet port 67 are formed in the bottom portion 62 of the process container 61. An exhaust tube 64 is connected to the exhaust port 63, and a throttle valve 65 and a vacuum pump 66 are connected to the exhaust tube 64 to perform pressure regulation. In addition, a gas supply pipe 68 is connected to the gas inlet port 67, and a gas supply source 69 is connected to the gas supply pipe 68 to supply a plasma excitation gas, such as Ar gas, or another gas, such as N$_2$ gas. In addition, a gas control part 70, which is configured by a gas flow controller, a valve, etc., is installed in the gas supply pipe 68.

Within the process container 61, a mounting mechanism 72 is provided in order to mount thereon a wafer W, which is a substrate to be processed. The mounting mechanism 72 includes a mounting stand 73 formed in a disc shape and a hollow cylindrical column 74 configured to support the mounting stand 73. The mounting stand 73 is formed of a conductive material, and is grounded through the column 74. A cooling jacket 75 is provided inside the mounting stand 73. In addition, a resistance heater 97 coated with an insulating material is embedded in the cooling jacket 75 inside the mounting stand 73. In addition, a wafer temperature is controlled by the cooling jacket 75 and the resistance heater 97.

On the top surface side of the mounting stand 73, an electrostatic chuck 76 to attract a wafer W is provided, which is configured by embedding an electrode 76b in a dielectric member 76a. In addition, the lower portion of the column 74 extends downward through an insertion hole 77 formed at the central portion of the bottom portion 62 of the process container 61. The column 74 is configured to be moved up and down by a lifting mechanism (not illustrated), and by this, the whole of the mounting mechanism 72 is moved up and down.

An extensible/contractible metal bellows 78 is provided to enclose the column 74. By the metal bellows 78, the lifting movement of the mounting mechanism 72 is allowed while maintaining the airtightness of the inside of the process container 61.

For example, three support pins 79 (only two support pins are illustrated) are installed vertically upward on the bottom portion 62, and pin insertion holes 80 corresponding to the support pins 79 are formed in the mounting stand 73. When the mounting stand 73 is moved down, a wafer W can be received by the upper ends of the support pins 79 that penetrate the pin insertion holes 80, respectively, and can be transferred between the upper ends of the support pins 79 and a transfer arm (not illustrated) that enters the inside from the outside. A carry-out/in port 81 is formed in the lower side wall of the process container 61 in order to allow the transfer arm to enter the inside therethrough, and the carry-out/in port 81 is opened/closed by a gate valve G.

A direct current (DC) power source 83 is connected to the electrode 76b of the above-described electrostatic chuck 76 via a power feeding line 82, and a DC voltage is applied to the electrode 76b from the DC power source 83 such that the wafer W can be attracted and held by an electrostatic force. In addition, a high frequency power source 84 for bias is connected to the power feeding line 82 so that a high frequency power for applying a bias power is supplied to the electrode 76b of the electrostatic chuck 76.

Meanwhile, a transmission plate 86 formed of a dielectric material is hermetically installed in the ceiling portion of the process container 61 via a seal member 87, and a plasma generation source 88 is provided above the transmission plate 86 to generate plasma of a plasma excitation gas in a processing space S within the process container 61.

The plasma generation source 88 includes an induction coil 90 installed to correspond to the transmission plate 86, and a high frequency power source 91 for plasma generation is connected to the induction coil 90 so that a high frequency power is introduced into the processing space S through the transmission plate 86 in order to form an induction electric field.

A baffle plate 92 made of a metal is installed just below the transmission plate 86 to diffuse the introduced high frequency power. Below the baffle plate 92, a target 93 is installed which is made of Cu or a Cu alloy and formed in an annular shape (annular truncated cone shape) that encloses the upper side portion of the processing space S and has an inwardly inclined section, and a voltage variable DC power source 94 is connected to the target 93 so that a DC power for drawing Ar ions is applied to the target 93. An alternating current (AC) power source may be used instead of the DC power source.

In addition, a magnet 95 is installed at the outer peripheral side of the target 93. The target 93 is sputtered by Ar ions in the plasma such that Cu or a Cu alloy is emitted, and most of them are ionized while passing the plasma.

In addition, below the target 93, a cylindrical metal-made protective cover member 96 is installed to enclose the processing space S. The protective cover member 96 is grounded. The inner end of the protective cover member 96 is installed to enclose the outer peripheral side of the mounting stand 73.

In the PVD apparatus configured as described above, a wafer W is carried into the process container 61, and the wafer W is mounted on the mounting stand 73 to be attracted by the electrostatic chuck 76. The mounting stand 73 is subjected to a temperature control by the cooling jacket 75 and the resistance heater 97 based on a temperature detected by a thermocouple (not illustrated).

In addition, a throttle valve 65 is controlled while causing Ar gas to flow at a predetermined flow rate within the process container 61 that is set to a predetermined vacuum state so as to maintain the inside of the process container 61 at a predetermined degree of vacuum. Thereafter, a DC power is applied to the target 93 from the variable DC power source 94, and a high frequency power (plasma power) is supplied to the induction coil 90 from the high frequency power source 91 of the plasma generation source 88. Meanwhile, a predetermined high frequency power for bias is supplied to the electrode 76b of the electrostatic chuck 76 from the high frequency power source 84 for bias.

By doing this, within the process container 61, argon plasma is formed by the high frequency power supplied to the induction coil 90 so that argon ions are produced, and the ions are drawn to the target 93 to which the DC current is applied, thereby colliding with the target 93 so that the target 93 is sputtered and particles are emitted. At this time, the amount of the emitted particles is optimally controlled by the DC voltage applied to the target 93.

In addition, most of the particles generated from the sputtered target 93 are ionized at the time of passing through the plasma and are scattered downwardly. At this time, the particles may be ionized with high efficiency by increasing the pressure within the process container 61 to a certain extent, and thereby increasing the plasma density. The ionization rate at this time is controlled by the high frequency power supplied from the high frequency power source 91.

The ions have a strong directivity, when they enter into an ion sheath region having a thickness of about several mm and formed on the surface of the wafer W by the high frequency power for bias which is applied to the electrode 76b of the electrostatic chuck 76 from the high frequency power source 84. Thus, the ions are drawn toward the wafer W side and are accelerated, thereby being deposited on the wafer W. By doing this, the film formation processing of the Cu-based film is performed.

When forming the Cu film, it is possible to make the fluidity of Cu better and to embed Cu with a good buriability by setting the wafer temperature to be high (65 degrees C. to 400 degrees C.), and by adjusting the bias power applied to the electrode 76b of the electrostatic chuck 76 from the high frequency power source 84 for bias, so that the film formation of Cu and etching by Ar is adjusted.

[ALD Apparatus]

Figure 10:
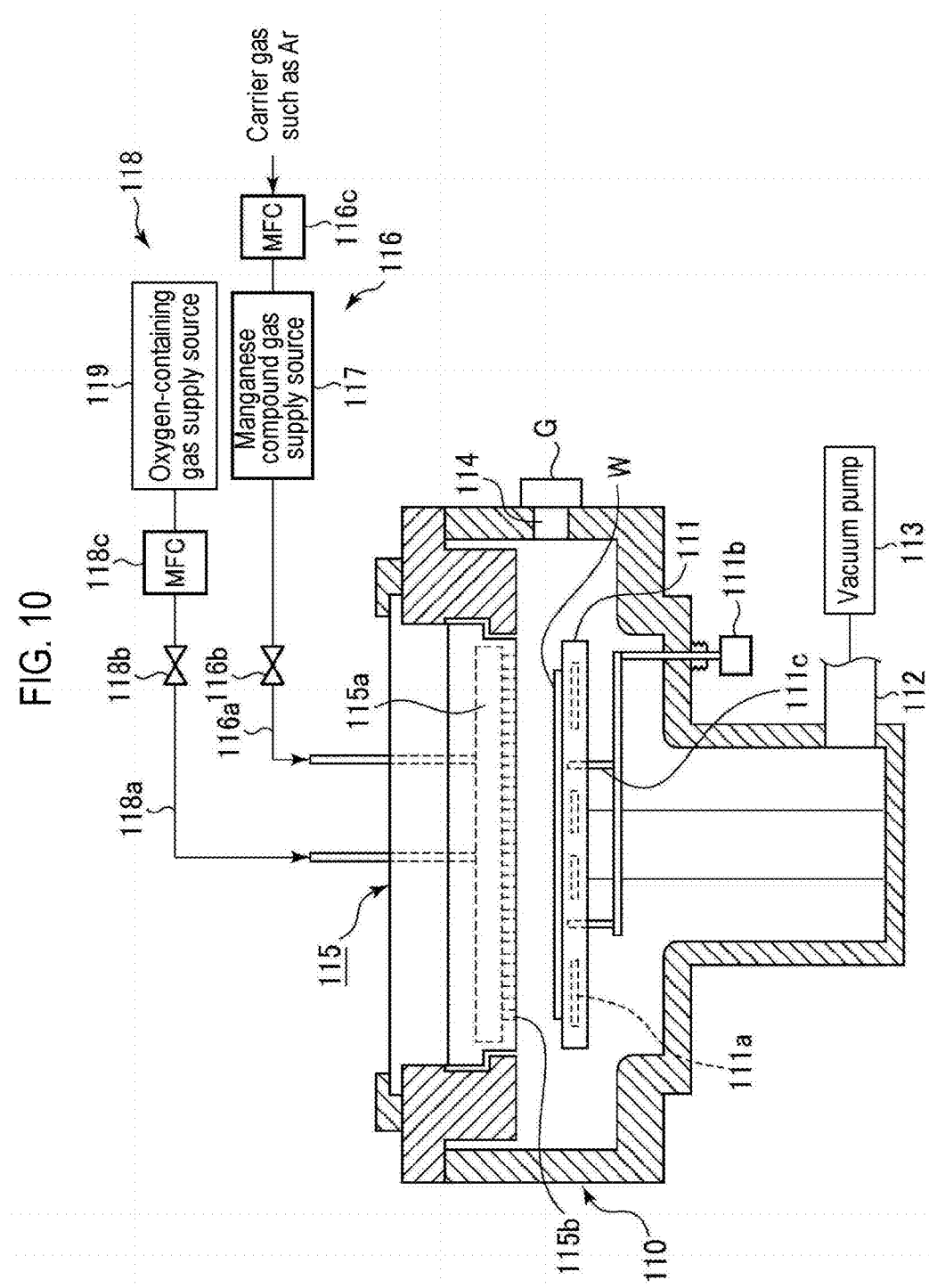
FIG. 10 is a sectional view illustrating an example of an ALD apparatus which may be properly used in a film formation apparatus of a $MnO_x$ film.

Next, descriptions will be made on an ALD apparatus that may be properly used in the $MnO_x$ film formation apparatuses 12a, 12b, 12c, and 12d used in the above-described processing system 100. FIG. 10 is a sectional view illustrating an example of an ALD apparatus that forms a $MnO_x$ film by the ALD method. In addition, the ALD apparatus may also be used in the Ru film formation apparatus 22 as a CVD apparatus.

As illustrated in FIG. 10, the ALD apparatus includes a process container 110. Within the process container 110, a mounting stand 111 is provided to mount a wafer W horizontally thereon. Inside the mounting stand 111, a heater 111a is installed, which serves as a temperature regulating means for the wafer. In addition, the mounting stand 111 is provided with three lifting pins 111c (only two lifting pins are illustrated), which are capable of being moved up and down by a lifting mechanism 111b. Through the lifting pins 111c, a delivery of a wafer W is performed between the wafer transfer means (not illustrated) and the mounting stand 111.

One end side of an exhaust tube 112 is connected to the process container 110, and a vacuum pump 113 is connected to the other end side of the exhaust tube 112. A transfer port 114 opened/closed by a gate valve G is formed in the side wall of the process container 110.

On the ceiling part of the process container 110, a gas shower head 115 is installed to face the mounting stand 111. The gas shower head 115 includes a gas chamber 115a, and a gas supplied to the gas chamber 115a is supplied to the inside of the process container 110 from a plurality of gas ejection holes 115b.

A manganese compound gas supply piping system 116 is connected to the gas shower head 115 so as to introduce the manganese compound gas into the gas chamber 115a. The manganese compound gas supply piping system 116 includes a gas supply path 116a, and a valve 116b, a manganese compound gas supply source 117, and a mass flow controller 116c are connected to the upstream side of the gas supply path 116a. The manganese compound gas is supplied from the manganese compound gas supply source 117 by a bubbling method. As a carrier gas for bubbling, Ar gas or the like may be used. The carrier gas also serves as a purge gas.

An oxygen-containing gas supply piping system 118 is connected to the gas shower head 115 so as to introduce an oxygen-containing gas into the gas chamber 115a. The oxygen-containing gas supply piping system 118 also includes a gas supply path 118a, and an oxygen-containing gas supply source 119 is connected to the upstream side of the gas supply path 118a through a valve 118b and a mass flow controller 118c. From the oxygen-containing gas supply source 119, for example, $H_2O$ gas, $N_2O$ gas, $NO_2$ gas, NO gas, $O_2$ gas, $O_3$ gas, or the like, is supplied as the oxygen-containing gas. In addition, the oxygen-containing gas supply piping system 118 is configured to be capable of supplying the Ar gas or the like as the purge gas.

Meanwhile, the present embodiment is configured such that the manganese compound gas and the oxygen-containing gas share the gas chamber 115a of the gas shower head 115, and are alternately supplied into the process container 110 from the gas ejection holes 115b. However, a gas chamber dedicated to the manganese compound gas and a gas chamber dedicated to the oxygen-containing gas may be independently provided in the gas shower head 115 so that the manganese compound gas and the oxygen-containing gas may be separately supplied into the process container 110.

In the ALD apparatus configured as described above, the wafer W is conveyed into the process container 110 from the transfer port 114, and is mounted on the mounting stand 111, of which the temperature is regulated to a predetermined temperature. In addition, a $MnO_x$ film with a predetermined film thickness is formed by an ALD method in which the supply of the manganese compound gas from the manganese compound gas supply piping system 116 and the supply of the oxygen-containing gas from the oxygen-containing gas supply piping system 118 are repeated a plurality of times with the inside of the process container 110 being purged between the supply of the oxygen-containing gas and the supply of the manganese compound gas. After the termination of the film formation, the processed wafer W is carried out from the transfer port 114.

[Hydrogen Radical Processing Apparatus]

Next, descriptions will be made on an example of a hydrogen radical processing apparatus used in the processing system 100.

Figure 11:
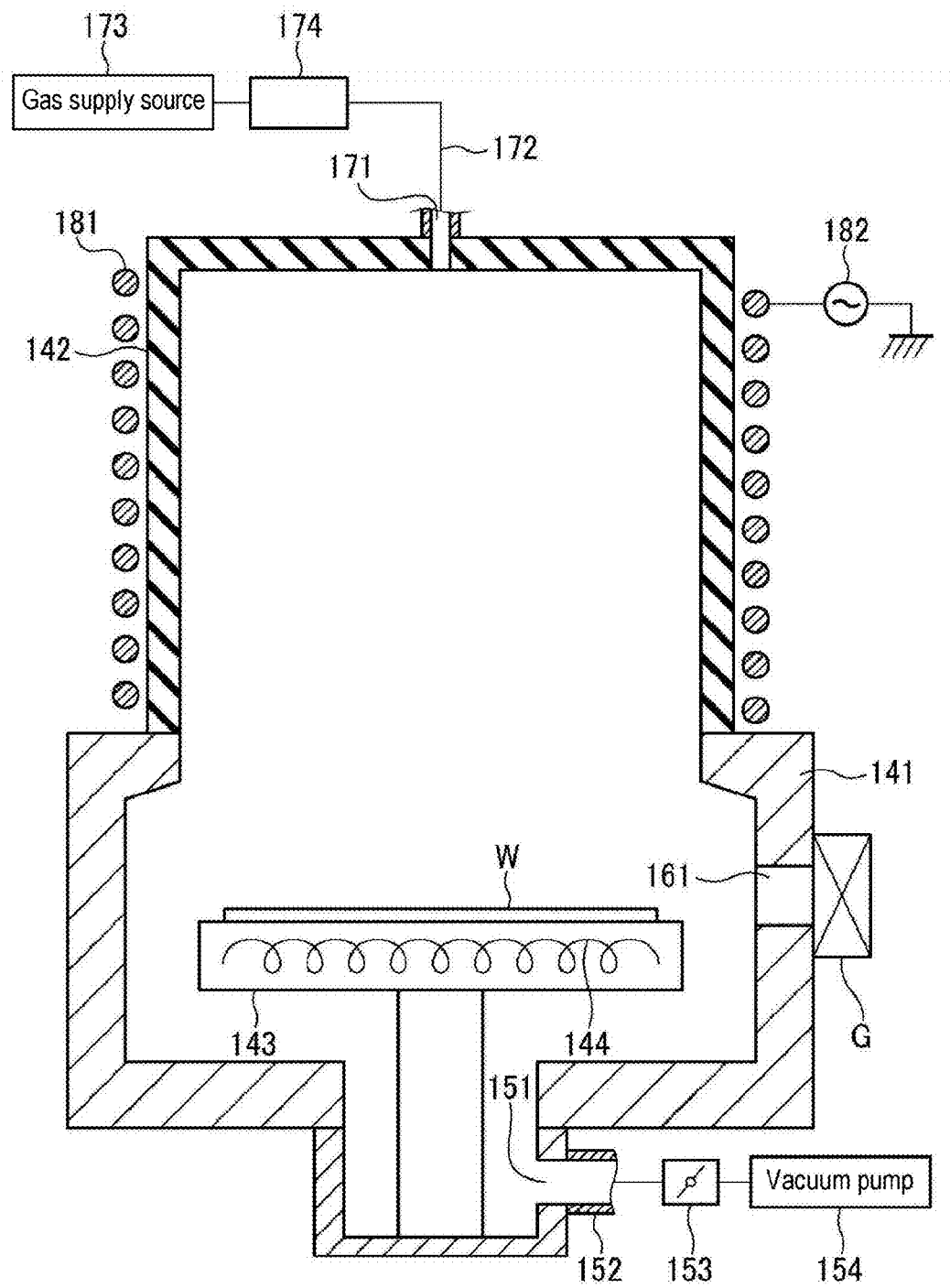
FIG. 11 is a sectional view illustrating an example of a hydrogen radical processing apparatus.

FIG. 11 is a sectional view illustrating an example of a hydrogen radical processing apparatus. Descriptions will be made with respect to a case in which hydrogen radicals are generated within the process container by a remote plasma processing, as an example.

As illustrated in FIG. 11, the hydrogen radical processing apparatus includes a process container 141 formed in a cylindrical shape from, for example, aluminum and configured to perform a hydrogen radical processing, and a cylindrical bell jar 142 installed above the process container 141 and formed of a dielectric material. The bell jar 142 has a diameter smaller than that of the process container 141, and the wall of the process container 141 and the wall of the bell jar 142 are hermetically formed. The inner portions of the bell jar 142 and the process container 141 communicate with each other.

A mounting stand 143 configured to mount a wafer W thereon and formed of a ceramic, such as, for example, MN, is disposed within the process container 141, and a heater 144 is provided inside the mounting stand 143. The heater 144 generates heat by being fed with power from a heater power source (not illustrated). The mounting stand 143 includes three wafer support pins (not illustrated) for conveying a wafer, which are installed to be projectable from/retractable into the surface of the mounting stand 143.

An exhaust port 151 is formed in the bottom portion of the process container 141, and an exhaust tube 152 is connected to the exhaust port 151. A throttle valve 153 and a vacuum pump 154, which perform pressure regulation, are connected to the exhaust tube 152 such that the inside of the process container 141 and the bell jar 142 can be evacuated. Meanwhile, a wafer carry-out/in port 161 of the wafer W is formed in the side wall of the process container 141, and the wafer carry-out/in port 161 is configured to be opened/closed by a gate valve G. In addition, the carry-out/in of the wafer W is performed in the state where the gate valve G is opened.

A gas inlet port 171 is formed at the center of the ceiling wall of the bell jar 142. A gas supply pipe 172 is connected to the gas inlet port 171, and a gas supply source 173 is connected to the gas supply pipe 172 so as to supply a hydrogen gas, an inert gas, or the like that are used for the hydrogen radical processing. In addition, a gas control part 174, which is configured by a gas flow controller, a valve, etc., is installed in the gas supply pipe 172.

A coil 181 serving as an antenna is wound around the bell jar 142. A high frequency power source 182 is connected to the coil 181. When the high frequency power is supplied to the coil 181 while the hydrogen gas and the inert gas are supplied into the bell jar 142, inductively coupled plasma is generated within the bell jar 142 and a hydrogen plasma processing is performed on the $MnO_x$ film of the wafer W within the process container 141.

In the hydrogen radical processing apparatus configured as described above, the gate valve G is opened to mount the wafer W on the mounting stand 143, then the gate valve G is closed, the inside of the process container 141 and the bell jar 142 are exhausted by the vacuum pump 154 so as to regulate the pressure inside the process container 141 and the bell jar 142 to a predetermined pressure by the throttle valve 153, and the wafer W on the mounting stand 143 is heated to a predetermined temperature by the heater 144. In addition, when the hydrogen gas, the inert gas, or the like for use in the hydrogen radical processing are supplied into the process container 141 through the gas supply pipe 172 and the gas supply port 171 from the gas supply source 173, and at the same time, the high frequency power is supplied to the coil 181 from the high frequency power source 182, the hydrogen gas, the inert gas, or the like is excited so that inductively coupled plasma is generated, and the inductively coupled plasma is introduced into the process container 141. In addition, the hydrogen plasma processing is performed on the $MnO_x$ film of the wafer W by the hydrogen radicals in the generated plasma.

<Other Application>

While embodiments of the present disclosure have been described above, the present disclosure may be variously modified without being limited to the above-described embodiments. For example, the above-described embodiments have illustrated a case in which a TiN film is used as a hard mask. Without being limited thereto, however, any other material may be used as long as an oxide having a strong bond, which is not substantially reduced in a hydrogen radical processing, is formed when the $MnO_x$ film is formed.

In addition, for example, the film formation system may be divided into a plurality of processing parts without being limited to the film formation system in which the processes up to the film formation of a Cu-based film are performed in an integrally configured processing part as in FIG. 7.

In addition, the present disclosure is applied to a case in which the CMP processing is performed after a Cu film is embedded in a trench, and is applicable regardless of the existence of a via hole or the configuration of a semiconductor device.

In addition, in the above-described embodiments, a semiconductor wafer has been described as a substrate to be processed, as an example. The semiconductor wafer is not limited to a silicon wafer, but may include a compound semiconductor of GaAs, SiC, GaN, or the like. In addition, without being limited to the semiconductor wafer, the present disclosure is also applicable to a glass substrate, a ceramic substrate, or the like that is used in a Flat Panel Display (FPD) of a liquid crystal display device, or the like.

According to the present disclosure, a hard mask is made of a material which allows an oxide to be formed when a $MnO_x$ film is formed on the hard mask, where the oxide is not substantially reduced in a hydrogen radical processing. A portion of the $MnO_x$ film corresponding to the hard mask becomes a first Mn-containing film by the hydrogen radical processing as it remains as an oxide, while a portion of the $MnO_x$ film corresponding to an interlayer insulating film becomes a second Mn-containing film which is reduced by the hydrogen radical processing such that Mn is formed on the surface thereof. A Ru film is not substantially formed on the first Mn-containing film, but is selectively formed on the second Mn-containing film. For this reason, it is possible to secure the mobility of a Cu-based film. Further, since a Ru film is not formed on the hard mask, it is not necessary to remove the Ru film through the CMP processing so that a problem encountered when removing the Ru film through the CMP processing can be solved.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    preparing a substrate having an interlayer insulating film and a hard mask provided on the interlayer insulating film and having a predetermined pattern;
    etching the interlayer insulating film using the hard mask to form a trench;
    forming a $MnO_x$ film through an ALD method in a state where the hard mask is left on the interlayer insulating film, the $MnO_x$ film being turned into a self-forming barrier film by reacting with the interlayer insulating film;
    performing a hydrogen radical processing on a surface of the $MnO_x$ film after forming the $MnO_x$ film;
    forming a Ru film through a CVD method after performing the hydrogen radical processing;
    forming a Cu-based film through a PVD method or by forming a Cu seed through the PVD method after forming the Ru film, and then performing a Cu plating processing so as to embed the Cu-based film within the trench; and
    performing a CMP method to remove the hard mask and to form a Cu wiring after performing the Cu plating processing,
    wherein the hard mask is made of a material which allows an oxide to be formed when the $MnO_x$ film is formed on the hard mask, the oxide not substantially reduced in the hydrogen radical processing,
    a portion of the $MnO_x$ film corresponding to the hard mask becomes a first Mn-containing film by the hydrogen radical processing as the oxide,
    a portion of the $MnO_x$ film corresponding to the interlayer insulating film becomes a second Mn-containing film which is reduced by the hydrogen radical processing such that Mn is formed on the surface thereof, and
    the Ru film is not substantially formed on the first Mn-containing film, and is selectively formed on the second Mn-containing film.

2. The method of claim 1, wherein the hard mask is formed of a TiN film.

3. The method of claim 1, wherein the $MnO_x$ film is formed by alternately supplying a manganese compound gas and an oxygen-containing gas into a process container in which the substrate is disposed with the inside of the process container being purged between supplying a manganese compound gas and supplying the oxygen-containing gas, and
    when forming the $MnO_x$ film, a substrate temperature is set to be lower than a thermal decomposition temperature of the manganese compound.

4. The method of claim 3, wherein the $MnO_x$ film has a film thickness of 1 nm to 5 nm.

5. The method of claim 1, wherein the hydrogen radical processing is performed for a period of 100 sec or more in a state where a substrate temperature is set to be between 200 degrees C. and 400 degrees C.

6. The method of claim 5, wherein the hydrogen radical processing is performed by supplying plasma of a gas containing hydrogen gas to the substrate.

7. The method of claim 1, wherein ruthenium carbonyl is used as a raw material for film formation when forming the Ru film.

8. The method of claim 1, wherein the Cu-based film is formed through an ionized PVD method in a state where a substrate temperature is set to be between 230 degrees C. and 350 degrees C.

9. A non-transitory computer-readable storage medium storing a program that is operated on a computer to control a processing system, wherein the program, when executed, causes the computer to control the processing system such that the method of claim 1 is performed.

* * * * *